United States Patent [19]
Ohki et al.

[11] 4,396,929
[45] Aug. 2, 1983

[54] GALLIUM NITRIDE LIGHT-EMITTING ELEMENT AND METHOD OF MANUFACTURING THE SAME

[75] Inventors: Yoshimasa Ohki, Sagamihara; Yukio Toyoda, Tokyo; Hiroyuki Kobayashi, Sagamihara; Isamu Akasaki, Machida, all of Japan

[73] Assignee: Matsushita Electric Industrial Company, Ltd., Osaka, Japan

[21] Appl. No.: 199,097

[22] Filed: Oct. 20, 1980

[30] Foreign Application Priority Data

Oct. 19, 1979 [JP] Japan .................... 54-135641
Apr. 23, 1980 [JP] Japan .................... 55-54518

[51] Int. Cl.³ ............... H01L 29/161; H01L 33/001; H01L 29/12; H01L 29/161
[52] U.S. Cl. ..................... 357/17; 357/16; 357/58; 357/61; 357/74
[58] Field of Search ............. 357/17, 59, 58, 61, 357/74

[56] References Cited

U.S. PATENT DOCUMENTS 3,852,796 12/1974 Cuomo et al. ............. 357/58 X
3,922,703 11/1975 Pankove ..................... 357/17 X
4,316,208 2/1982 Kobayashi et al. ......... 357/17 X

FOREIGN PATENT DOCUMENTS 54-135641 10/1979 Japan .
55-54518 4/1980 Japan .

*Primary Examiner*—James W. Davie
*Assistant Examiner*—J. Carroll
*Attorney, Agent, or Firm*—Lowe, King, Price & Becker

[57] ABSTRACT

The substrate of a gallium nitride light-emitting diode is made rough at given positions on the surface thereof, or an insulating film strip pattern is attached on the surface of the substrate prior to growing an n-type conductive gallium nitride layer and a semi-insulating gallium nitride layer thereon. As a result, high conductivity regions are formed in the semi-insulating layer at positions corresponding to the rough surfaces or the insulating film strip pattern in such a manner that each of the high conductivity region extends from the n-type conductive layer to the upper surface of the semi-insulating layer so as to function as a conductor to be connected to an electrode. In the same manner similar high conductive regions are made along kerf portions in a diode wafer, preventing each diode chip from being damaged on cutting.

18 Claims, 23 Drawing Figures

GALLIUM NITRIDE LIGHT-EMITTING ELEMENT AND METHOD OF MANUFACTURING THE SAME

FIELD OF THE INVENTION

This invention generally relates to a light-emitting diode, and particularly, the present invention relates to a gallium niride light-emitting element and a method of manufacturing the same.

BACKGROUND OF THE INVENTION

Gallium nitride has not been widely used for light-emitting diodes because a light-emitting diode having a gallium nitride element has various disadvantages. Namely, in a known gallium nitride light-emitting diode which was experimentally manufactured, an electrode has to be connected to the side of a light-emitting diode chip made of gallium nitride, and this electrode has to be connected via a connecting wire to an external terminal in order to apply a necessary voltage across the light-emitting diode chip. However, it is very difficult and troublesome to connect such an electrode to the side of a light-emitting diode chip and to connect the electrode via a connecting wire to an external terminal.

Moreover, when a diode wafer is cut into a number of small diode chips, stress is applied to single crystal constituting the gallium nitride layers. As a result, a number of cracks are apt to be made in the single crystal lowering the yield in manufacturing. Therefore, such a known gallium nitride light-emitting diode as well as the manufacturing method of the same is not suitable for mass production.

SUMMARY OF THE INVENTION

The present invention has been developed in order to remove the above-mentioned disadvantages and drawbacks inherent to the known gallium nitride light-emitting diode.

It is, therefore, a primary object of the present invention to provide a gallium nitride light-emitting element in which the diode chip can be electrically connected to the external terminal without using a wire.

Another object of the present invention is to provide a gallium nitride light-emitting element in which each diode chip is prevented from being damaged when cutting a diode wafer.

A further object of the present invention is to provide a method of manufacturing gallium nitride light-emitting elements in which the yield or productivity in mass production has been improved.

A still further object of the present invention is to provide a method of manufacturing gallium nitride light-emitting elements in which freedom in work is increased.

In accordance with the present invention, a given portion of a substrate surface, on which gallium nitride layers will be grown, is made rough or an insulating strip film is placed on the given portion in advance prior to vapor phase epitaxial growth of gallium nitride layers. A first n-type gallium nitride layer is grown on the substrate, and then a second gallium nitride layer doped with an acceptor impurity is grown on the first layer. The second gallium nitride layer becomes a semi-insulating layer except for a region corresponding to the rough surface of the substrate or the the position where the insulating film strip is attached. This region shows an n-type high conductivity to function as a conductor so that the first n-type gallium nitride layer is electrically connected to a suitable electrode via the conductive region at the level of the top surface of the second gallium nitride layer which is semi-insulating. Another electrode is connected to the top surface of the semi-insulating layer, and these two electrodes are directly connected to external terminals respectively, such as stem electrodes, of a light-emitting element.

Furthermore, in order to prevent the occurrance of cracks in the single crystal of the gallium nitride layers polycrystalline regions are formed in the peripheral portions of each light-emitting element chip. Such policrystalline regions are made by either making the corresponding position on the substrate rough or by attaching insulative film strips to the same position in advance before the vapor phase epitaxial growth of gallium nitride takes place. With this arrangement, the single crystalline portion of each diode chip is prevented from suffering cracks since stress on cutting of the diode wafer does not directly transmit to each single crystalline portion because of the polycrystalline regions. Simultaneously, cracks, which occur during cooling after the growth of crystals, are reduced.

BRIEF DESCRIPTION OF THE DRAWINGS

These and other objects and features of the present invention will be more readily apparent from the following detailed description of the preferred embodiments taken in conjunction with the accompanying drawings in which.

DETAILED DESCRIPTION OF THE PREFERRED EMBODIMENTS

Prior to describing the preferred embodiments of the present invention, a conventional gallium nitride light-emitting diode will be discussed for a better understanding of the objects and features of the prsent invention.

Figure 1:
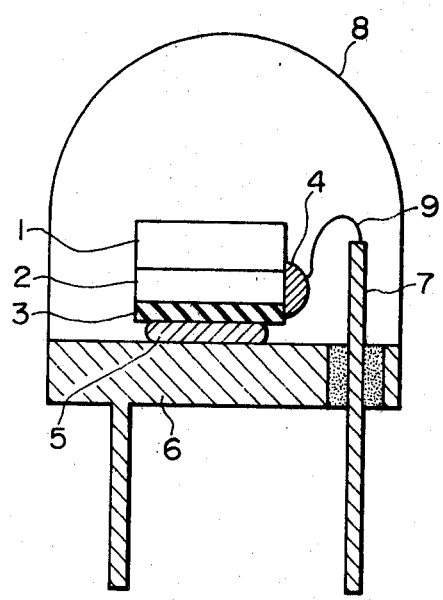
FIG. 1 is a cross-sectional view of a known gallium nitride light-emitting diode.

FIG. 1 illustrates a schematic cross-sectional view of a known gallium nitride light-emitting diode. The diode of FIG. 1 comprises a substrate 1 made of sapphire, an n-type gallium nitride layer 2, and a p-type or semi-insulating gallium nitride layer 3, which will be referred to as an i-layer hereinbelow. The n-type layer 2 is formed on one surface of the substrate 1, and then the i-layer 3 is formed on the other surface of the n-type layer 2. A metallic plate 5 is formed on the other surface of the i-layer 3 by a suitable technique, such as vapor deposition, while, an n-type ohmic electrode 4 is formed on an exposed side surface of the n-type layer 2. The metallic electrode 5 is fixedly and electrically connected to a metallic stem 6, while the electrode 4 is electrically connected via a connecting wire 9 to a metallic post 7 which is insulated from the stem 6. The combination of the substrate 1 and the layers 2 and 3 may be called a diode chip, and the diode chip is covered by a suitable packaging 8 having a lens at the top thereof.

The above-mentioned conventional light-emitting diode is usually called an M-I-N type, and the diode chip emits light when a suitable voltage is applied across the mettalic stem 6 and the metallic post 7.

In the above-described conventional light-emitting diode, the wire 9 may suffer from burn-out. Furthermore, it is very difficult and troublesome to connect the electrode 4 connected to the side of the diode chip to the post 7. Therefore, the manufacturing process may be complicated depending on the number of diode chips to be installed, on the shape and material of the stem to be installed, and on the material of the packaging having a lens so that the reliability is apt to lower, while the GaN conventional light-emitting diode is not suitable for mass production.

Since a large single crystal ingot of gallium nitride per se has not been obtained hitherto, a semiconductor material or an insulating single crystal is used as an epitaxial growth substrate when manufacturing a gallium nitride element. As a material of the substrate for the gallium nitride element, which material is widely used in the practical use, is sapphire single crystal, i.e. an alumina single crystal $\alpha$-$Al_2O_3$, when spinel and silicon carbide are also known. All of these materials are rigid so that it is necessary to cut the same by means of a special tool, such as a dicing saw having a blade constructed of pressed diamond grains, into a number of element chips. However, when performing cutting by this method, a great force is applied to the crystals. Therefore, in order to perform cutting in a stable manner it is preferable that the internal strain of the crystal is as small as possible. On the other hand, the physical properties, such as the lattice constant and the thermal expansion coeffficient, of the gallium nitride crystal differ from those of the material of the substrate. For instance, in case of using a substrate made of sapphire single crystal, after a vapor phase epitaxial layer has been grown at about 1000 degrees centigrade, when the crystal wafer is cooled down to the room temperature, the whole crystal wafer bends in such a manner that the gallium nitride layer side is convexly curved. Simultaneously, a number of cracks are made in the sapphire substrate and in the gallium nitride layer. These cracks are the sources of reducing the yield because the wafer is apt to split at undesirable portions and some portions of the gallium nitride layer get chipped in the subsequent process, namely in the process of forming electrodes and cutting.

In addition, the above-mentioned element has to be assembled in the form of a flip-chip in practice since it has an M-I-N structure which is different from that of customary light-emitting diodes having P-N junction structure.

Figure 2A:
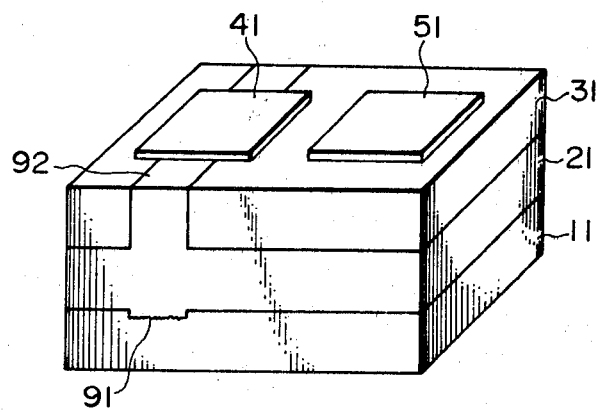
FIG. 2A is a schematic perspective view of a first embodiment of the gallium nitride light-emitting diode chip according to the present inveniton.
Figure 2B:
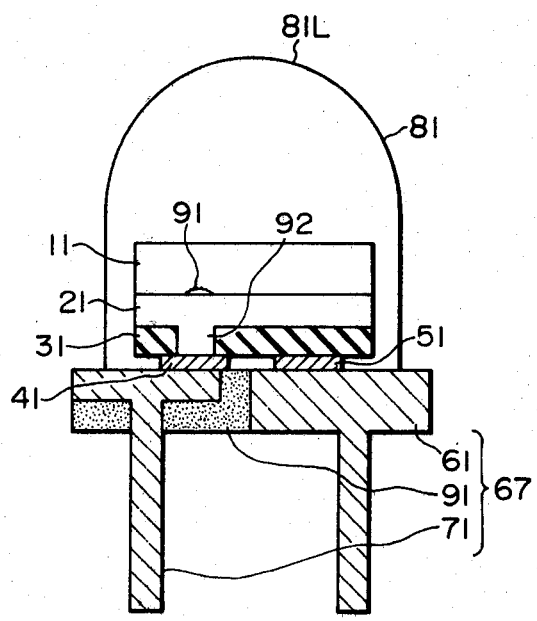
FIG. 2B is a schematic cross-sectional view of the diode chip of FIG. 2A, mounted on a stem assembly and covered by a packaging.

Reference is now made to FIGS. 2A and 2B which show a first embodiment of the light-emitting diode according to the present invention. FIG. 2A is a schematic perspective view of a light-emitting diode chip, and FIG. 2B is a cross sectional view of the light-emitting diode chip mounted on a stem assembly and covered by a packaging.

A reference numeral 11 designates a substrate made of sapphire or the like. A single crystal of either semiconductor or insulative material may be used as the substrate. An undulatory portion 91, such as a cut groove, is made in the form of a strip on one surface of the substrate 11. As a result, an n-type conductive gallium nitride (GaN) layer 21 is grown on the substrate 11, and a semi-insulating gallium nitride layer 31 is grown on the n-type gallium nitride layer 21. An n-type region 92 having pits and showing high conductivity is made in the semi-insulating gallium nitride layer 31 at a position corresponding to the undulatory portion 91. The free carrier density of the n-type high conductivity region 92 is greater than $10^{19}/cm^3$, while the free carrier density of the n-type conductive region 21 is $10^{17}$ to $10^{19}/cm^3$. This n-type high conductivity region 92 is integrally formed with the n-type conductive gallium nitride layer 21 and is extending to the exposed surface of the semi-insulating gallium nitride layer 31.

The above-mentioned undulatory portion 91 may be made by making a given portion of the surface of the substrate 11 rough in advance. Ultrasonic machining, sandblasting or the like may be performed to make the undulatory portion 91. However, such an undulatory portion 91 may be also made by providing one or more grooves scratching a given portion of the substrate 11 surface by a suitable tool, such as a scriber or a dicer.

An ohmic electrode 41 is formed on the top surface of the chip in such a manner that the electrode 41 is in contact with at least a portion of the n-type high conductivity region 92. A metallic electrode 51 is formed on the semi-insulating gallium nitride layer 31 in such a manner that the electrode 51 does not contact the n-type high conductivity region 92. The semi-insulating gallium nitride layer 31 may be referred to as an i-layer, and the metallic electrode 51 may be referred to as an i-layer electrode hereinafter.

In FIG. 2B, a reference numeral 67 designates a stem assembly 67 which comprises first and second stem electrodes 61 and 71, and an insulator 91. The first and second stem electrodes 61 and 71 are insulated from each other by the insulator 91, which is fixedly connected to these electrodes 61 and 71. The stem assembly 67 serves as a base for the light-emitting diode chip. Namely, the light-emitting diode chip of FIG. 2A is turned upside down, and is fixedly supported by the stem electrodes 61 and 71 in such a way that the n-type ohmic electrode 41 is in contact with the second stem electrode 71, while the i-layer electrode 51 is in contact with the first stem electrode 61. In detail, these electrodes 41 and 51 are respectively bonded to the stem electrodes 71 and 61.

The light-emitting diode chip mounted on the stem assembly 67 is covered by a suitable packaging 81 having a lens 81L at the top thereof. In order to make the light-emitting diode chip emit light, a suitable voltage is applied across the first and second stem elctrodes 61 and 71.

From the above it will be understood that there is no need to make a connection by means of a wire or code between the light-emitting diode chip and a stem electrode inasmuch as the electrical connection for the n-type gallium nitride layer 21 is performed via the n-type high conductivity region 92, which extends to the exposed surface of the i-layer 31, and via the metallic electrode 41 formed on the n-type high conductivity region 92. Accordingly, there is no fear of burn-out of a wire. As a result, the yield or productivity of manufactured light-emitting diodes is prevented from lowering. Furthermore, since there is no need to make a connection by means of a wire, the invention provided a simple process for manufacturing light-emitting diodes.

Although, in the above-described first embodiment, the undulatory portion 91 has a strip-like shape, the shape thereof is not limited to such a rectangular shape. Namely, the undulatory portion may be formed in any desirable shape, for instance, it may take a circular shape if necessary.

The manufacturing process of the light-emitting diode of FIGS. 2A and 2B will be further described in detail with reference to FIGS. 3A to 3E.

Figure 3A:
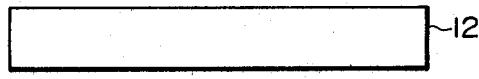
FIG. 3A to 3E show the manufacturing process of the diode chip of FIG. 2A.
Figure 3B:
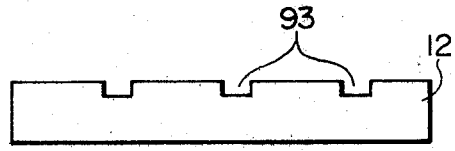
Figure 3D:
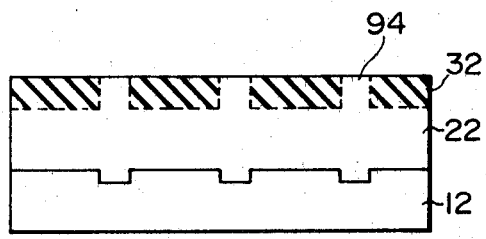
Figure 3C:
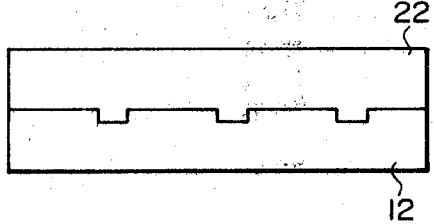
Figure 3E:
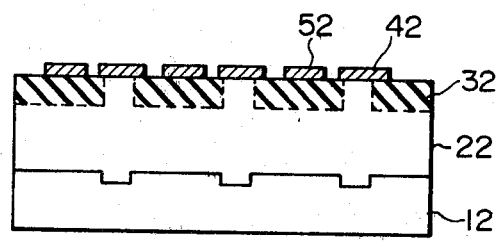

As illustrated in FIG. 3A a substrate 12 made of sapphire is provided. Then grooves or scratched portion 93 are made by means of a suitable tool or machine, such as a scriber or dicer, on one surface of the substrate 12 as shown in FIG. 3B. On the surface of the substrate 12 is formed an n-type gallium nitride layer 22 by vapor phase epitaxial growth method or the like as shown in FIG. 3C. Then another gallium nitride layer 32 is formed on the n-type layer 22 in such a manner that an impurity element, such as zinc, is doped during growth of the gallium nitride layer 32. As a result, the gallium nitride layer 32 becomes semi-insulating. However, it is to be noted that regions of the gallium nitride layer 32 corresponding to the grooves 93 do not become semi-insulating. These portions, which are designated at 94, become crystals including pits which exhibit n-type high conductivity. After the semi-insulating gallium nitride layer 32 and the n-type high conductivity regions 94 are formed, n-type ohmic electrodes 42 and i-layer electrodes 52 are respectively formed on the top surface of the n-type high conductivity regions 94 and the semi-insulating gallium nitride layer portions 32 as illustrated in FIG. 3E. The n-type ohmic electrodes 42 are formed in such a manner that each of the n-type ohmic electrodes 42 is in contact with at least a portion of the n-type high conductivity region 94. The intermediate product of FIG. 3E may be referred to as a light-emitting diode wafer, and this wafer is cut into a plurality of small chips by means of a suitable machine, such as a dicer. Each small chip corresponds to the light-emitting diode chip of FIG. 2A.

Although, in the above-described first embodiment, the wafer is simply cut along given kerf lines into a number of small chips after the completion of the wafer, the structures of the crystals at kerf portions, at which each chip will be separated from another, may be made different from that of the remaining portions of the crystals.

Hence, a second embodiment of the light-emitting diode according to the present invention, in which the crystalline structure at kerf portions made different, will be described hereinbelow. In the second embodiment, kerf portions, at which each chip is separated from another, are formed in such a manner that the vapor phase epitaxial growth there is performed irregularly or unevenly, such as polycrystal growth. Since irregular or uneven growth is performed at portions in the wafer including at least the kerf, each region in the wafer which corresponds to each light-emitting diode chip comprises a single crystalline portion surrounded and thus separated by the irregularly grown crystalline portions, such as polycrystalline portions. In order to make such polycrystalline portions in the gallium nitride layer, strip-like films made of $SiO_2$, $Al_2O_3$, $Si_3N_4$ or the like are attached to the surface of the substrate in advance before the gallium nitride layers are grown thereon.

The width of the above-mentioned irregular or uneven epitaxial growth portions may be wider than, equal to, or narrower than the actual kerf width which corresponds to the thickness of a blade of a cutting machine, such as a dicing machine. If each of the irregularly grown epitaxial layer portions has a width wider than the actual kerf width, the cutting force is not directly applied to the single crystal portions.

Generally speaking, in a gallium nitride single crystal portion grown on a substrate, there are a number of small cracks caused from the difference in thermal expansion coefficient between the gallium nitride layer and the substrate. However, when a plurality of single crystal regions are formed with the size of a light-emitting diode chip as described in the above, the number of cracks per each chip can be considerably reduced compared to the number of cracks in a large wafer of single crystal. Furthermore, because strain which occurs on cutting at the kerf does not directly transmit to each single crystal region especially when the irregularly grown layer width is wider than the kerf width, the peripheral portions of each chip do not suffer from undesirable split. However, the width should be selected in view of an undesirable influence caused by a leakage current because such a leakage current tends to increase as the width of the irregularly grown layer widens.

It has been already found by the present inventors that in case of forming an i-n junction by growing an i-layer doped with zinc after the vapor phase epitaxial growth of n-type gallium nitride, if a given machining had been done in advance to the surface of the substrate, the gallium nitride crystal grown on the machined region does not become insulating, but exhibits n-type conductivity although a great amount of zinc is added thereto. Although the above-mentioned method can be adopted to form irregularly grown layer portions, in this second embodiment another method is adopted.

Namely, the present inventors have provided a region having an insulating film or thin layer on the substrate in place of the above-mentioned undulatory portion. The insulating film whose width may be smaller than the aforementioned strip-like film width corresponding to kerf portions are placed on the substrate surface in the same manner as the aforementioned kerf portions. The width of the strip-like insulating film, which is used in place of the undulatory portion, is preferably less than 50 micrometers in practice. With the provision of the above-mentioned insulating film placed on the substrate before the vapor phase epitaxial growth of gallium nitride, the substrate does not suffer from cracks, resulting in a remarkable improvement in yield and work.

The n-type high conductivity region grown on the insulating film strip in the above-mentioned manner is of irregular or uneven polycrystalline. Such an irregular or uneven polycrystalline region as well as the aforementioned kerf region has a different optical characteristic from that of a region made through single crystal growth. Namely, the light incident on the gallium nitride layer through the substrate is scattered at the polycrystalline region so that the high conductivity region to be connected to the ohmic electrode and the kerf region can be clearly seen through the back of the transparent sapphire substrate. Consequently, the kerf regions in a wafer to be cut can be readily ascertained through the substrate without involving any extra process, such as grinding, so that the freedom in machining, such as cutting, of the wafer from the back side thereof is increased. In addition, n-side and i-side electrodes are readily distinguished from each other through the back of each chip when intended to effect bonding after each chip is separated. Especially, when performing bonding in flip-chip method. As in case of gallium nitride, this shows a remarkable improvement in work, while errors are prevented so that it is possible to greatly increase the yield.

Examples of the light-emitting diode based on the above-described first and second embodiments of the present invention will be described hereinbelow.

[EXAMPLE 1]

In the first embodiment of FIGS. 2A and 2B, the substrate 11 is made of sapphire, and the undulatory portion 91 is made by scratching the surface of the substrate by a scriber. The n-type semiconductive layer 21 is formed by vapor phase epitaxial growth method using gallium nitride having carrier density "n" expressed by $n \approx 10^{17}$ to $10^{19}/cm^3$. The thickness of the n-type semiconductive layer is between 10 and 100 micrometers. The semi-insulating layer 31 is formed by vapor phase epitaxial growth method using gallium nitride added with for instance, zinc as impurity of p-type. The thickness of the semi-insulating layer 31 is less than 20 micrometers. The metallic electrodes 41 and 51 are respectively formed by vacuum evaporation method using a masking pattern. The chip of FIG. 2A is mounted on the stem assembly 67 by means of thermocompression bonding method.

The light-emitting diode of the above-described example 1 emits light of green to blue-purple region.

[EXAMPLE 2]

An example 2 is made in the same manner as the example 1 except for the material for the substrate 11. Namely, the substrate 11 is made of spinel single crystal or hexagonal system silicon carbide. The second embodiment light-emitting diode emits light of green to blue-purple region in the same manner as the example 1.

[EXAMPLE 3]

An example 3 differs from the example 1 in that the grooves are made by means of a dicer in place of the scriber. The width of each groove is approximately 100 micrometers, and a high conductivity region including a number of pits are obtained in the form of strips whose each width equals the width of the corresponding groove. The example 3 light-emitting diode emits light of green to blue-purple region in the same manner as the example 1.

[EXAMPLE 4]

Figure 4A:
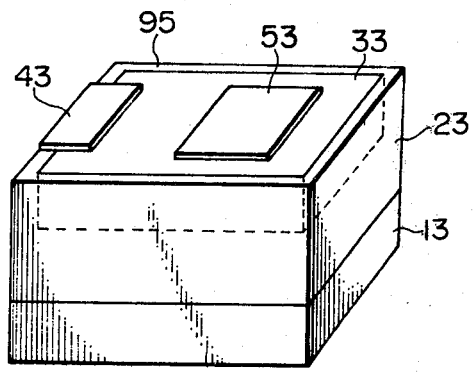
FIG. 4A is a schematic perspective view of a gallium nitride light-emitting diode chip according to an EXAMPLE 4 based on a second embodiment, of the presnet invention.
Figure 4B:
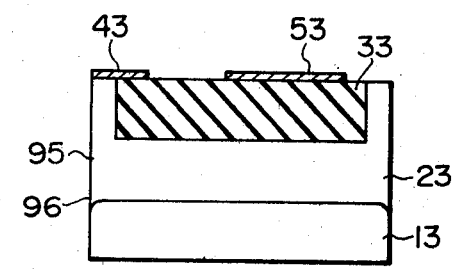
FIG. 4B is a schematic cross-sectional view of the diode chip of FIG. 4A.

In the example 1, the force applied to the scriber is increased to an extent that the depth of the groove reaches approximately 5 micrometers, and the grooves are made in a lattice fashion on the surface of the substrate 13 (see FIGS. 4A and 4B) made of sapphire. The gallium nitride crystal 23 is grown on the substrate 13 where regions including a number of pits are made on the grooves. Simultaneously, cracks are made in the sapphire substrate 13 along the grooves. Each chip is separated from another along these cracks to obtain a light-emitting diode as shown in FIGS. 4A and 4B. Namely, if the grooves are made in the above-mentioned lattice or rectangular fashion on the substrate 13 in advance, the conductive regions including a number of pits are formed in such a manner that these conductive regions surround the diode chip, to reach the upper surface level of the semiinsulating layer 33. An n-type electrode 43 is formed on the surface of chip in such a manner that the electrode 43 is in contact with the conductive region 95. Another i-layer electrode 53 is formed on the surface of the chip in such a manner that the electrode 53 does not contact the conductive region 95 but the i-layer 33. After the electrodes 43 and 53 are formed, the entire wafer is pressed slightly by means of a roller to obtain a light-emitting diode chip as illustrated in FIG. 4A and FIG. 4B. A reference numeral 23 designates an n-type conductive gallium nitride layer. The example 4 light-emitting diode also emits light of green to blue-purple region.

[EXAMPLE 5]

Figure 5A:
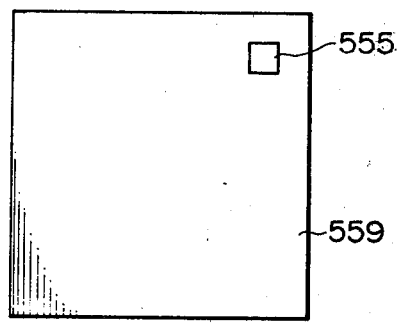
FIG. 5A is a schematic top plan view of a diode chip for displaying a figure or a letter, on which diode chip no electrodes have been formed yet, the diode chip of FIG. 5A corresponding to an EXAMPLE 5 which is based on either first or second embodiment.
Figure 5B:
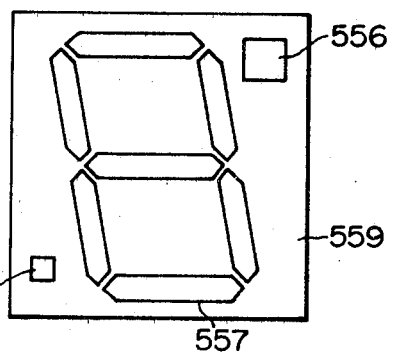
FIG. 5B is a schematic top plan view of the diode chip of FIG. 5A as having electrodes for displaying a figure.

FIGS. 5A and 5B illustrate an example 5 in which a light-emitting diode is used for numerical display. FIG. 5A shows a chip corresponding to one figure in the absence of electrodes. Namely, a region 555 on the substrate (not shown) is made rough by means of ultrasonic machining, and then an n-type layer and a semi-insulating layer 559 are formed thereon in the same manner as in the example 1. A region in the surface of the chip corresponding to the region 555, which has been made rough, shows n-type high conductivity, while remaining regions 559 exhibit high-resistance.

By using a crystal of FIG. 5A a light-emitting diode chip is completed by forming electrodes 556, 557 and 558 on the surface of the crystal. In detail, the electrode of n-side is formed on a position corresponding to the machined regions 555 of FIG. 5A, while the electrode 557 is made in the form of "8" of seven-segment. The electrode 558 is for a decimal point. The latter electrodes 557 and 558 are formed on the semi-insulating layer 559. The electrodes 556 to 558 are connected to a power supply in such a manner that the n-side electrode 556 is connected to the negative side, while both the electrode having the shape of "8" and the electrodes 558 for decimal point are connected to the positive side. When a suitable voltage is applied to the electrodes 556 to 558 in this way, the light-emitting diode of FIG. 5B emits light of green to blue-purple region.

Preferably, the size of the n-side electrode 556 may be made different from that of the decimal point electrode 558 so that it will be easy to distinguish one from another when bonding these electrodes 556 and 558 to the corresponding stem electrodes by viewing through the back of the substrate. Although the example 5 is directed to a figure pattern light-emitting diode as described in the above, a dot-matrix may be used in place of the seven-segment pattern of "8" for displaying letters.

[EXAMPLE 6]

Figure 6A:
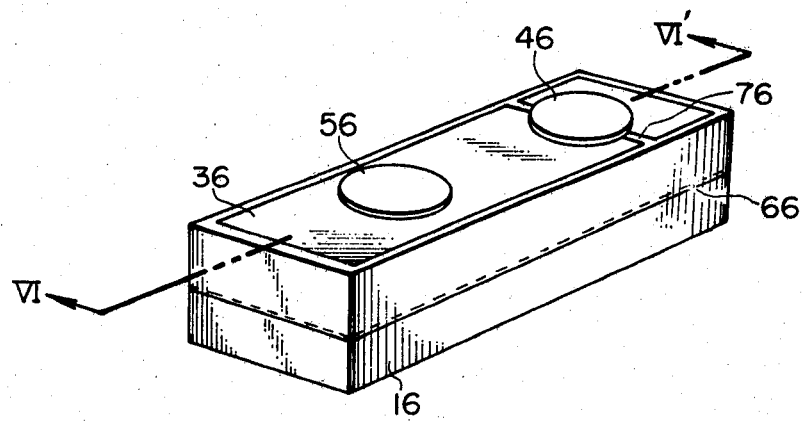
FIG. 6A is a schematic perspective view of a light-emitting diode chip according to an EXAMPLE 6 which is based on the second embodiment.
Figure 6B:
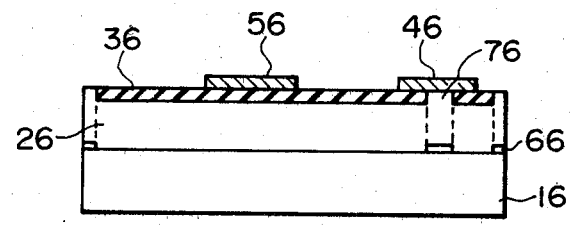
FIG. 6B is a schematic cross-sectional view of the diode chip of FIG. 6A.

FIGS. 6A and 6B show an example 6 of the light-emitting diode which is manufactured by providing an insulating layer on the surface of the substrate. FIG. 6A is a perspective view of the diode chip, and FIG. 6B is a cross-sectional view taken along the line VI—VI' of FIG. 6A. A reference numeral 16 designates a substrate made of sapphire, and a film or layer 66 of alumina is attached to the surface of the substrate at the peripheral portions thereof. A reference numeral 26 designates a single crystal of gallium nitride which has been grown on the surface of the substrate uncovered by the alumina film strips 66. Electrodes 46 and 56 are provided at the top surface of the chip. The references 36 and 76 respectively indicate an i-type gallium nitride layer and an n-type high conductive layer. The manufacturing process of the chip of FIGS. 6A and 6B will be described in detail with reference to FIGS. 7A to 7D and FIG. 8.

Figure 7A:
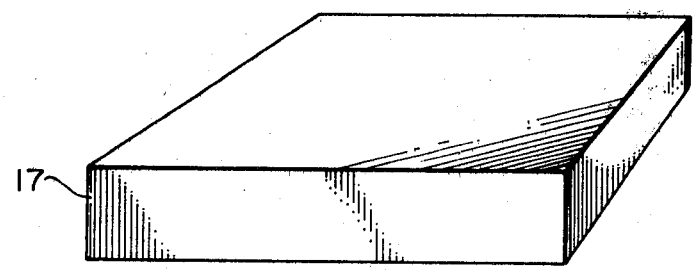
FIG. 7A to 7D show the manufacturing process of the diode chip of FIGS. 6A and 6B.
Figure 7B:
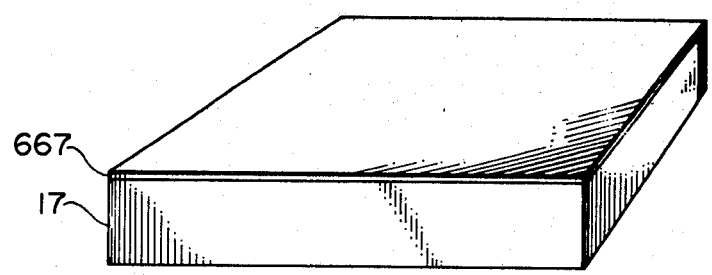
Figure 7C:
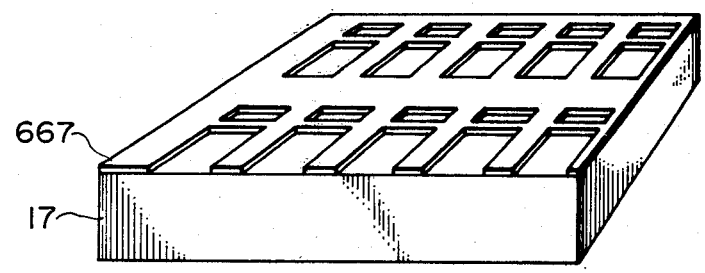
Figure 7D:
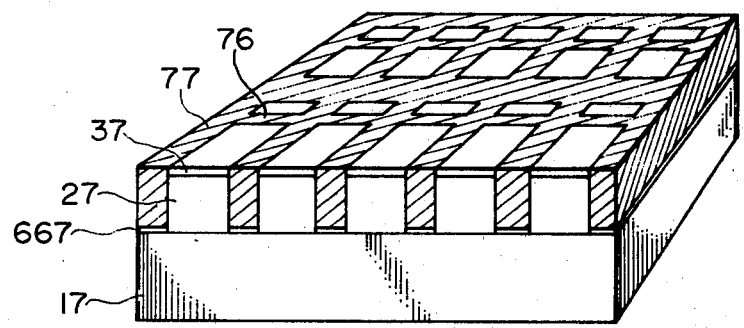
Figure 8:
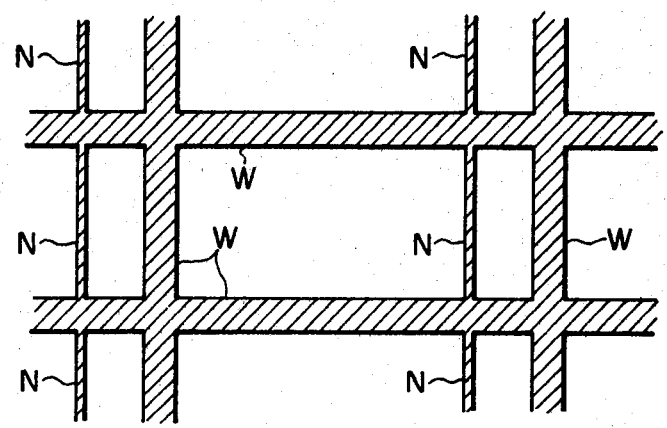
FIG. 8 shows an alumina film pattern used for manufacturing the diode chip of FIGS. 6A and 6B.

FIG. 7A shows a sapphire substrate 17 which corresponds to the substrate 16 of FIGS. 16A and 16B, and a 3000 Å thick alumina film 667 is formed on the surface of the substrate 17 as shown in FIG. 7B by means of a suitable method, such as electron beam vacuum evaporation method. The film 667 is given a predetermined pattern as shown in FIG. 7C by a well known photolithographical method. The same pattern is also shown in FIG. 8 with an enlarged view. In FIG. 8, the hatched portion corresponds to the alumina film portion, and in the remaining portions the alumina film has been removed so that the surface of the substrate 17 is exposed. As shown in FIG. 8, the alumina film 667 pattern comprises wide and narrow bands W and N. The width of each wide band W is 180 micrometers which is a little wider than the width of kerf to be made therein, which is approximately 150 micrometers. On the other hand, the width of each narrow band N is 20 micrometers, and a high conductivity region will be formed above this narrow band N to be connected to the n-side electrode 46 as will be described hereinbelow. On the substrate 17 having the above-mentioned alumina film pattern, are an n-type conductive gallium nitride layer 27 and an i-type gallium nitride layer 37 by the vapor phase epitaxial growth method as illustrated in FIG. 7D. This i-type gallium nitride layer 37 corresponds to the i-type gallium nitride layer 36 shown in FIGS. 6A and 6B. An n-type conductive crystal region is grown on the alumina film 667 pattern where the crystal orientation or arrangement is not uniform. In the wafer of FIG. 7D, each gallium nitride single crystal region 27, 37 is separated from each other by the n-type high conductive regions 76 and 77 (polycrystalline portion), and is independent from each other so that forces applied thereto are readily dispersed. As a result, the bend as the whole wafer is small, while the number of cracks made in the crystalline is considerably reduced. Since the bend of the wafer is small, it is possible to form electrodes by means of photolithographical method so that a wide freedom in machining has been introduced. Furthermore, since the band width of the high conductivity region 77 is made wider than the kerf width defined by the thickness of a blade of a cutting machine, such as a dicer, and since the number of cracks has been reduced, undesirable split of a portion of a chip is prevented and thus the yield has been remarkably improved. In addition, since the n-type high conductivity region 76 corresponding to the narrow band region N in FIG. 8 is opaque so that this opaque portion 76 can be clearly seen through the back of the transparent substrate 16 when the chip is bonded to a header by flip-chip method. Namely, the n-type high conductivity region 76 can be easily distinguished from other portions resulting in a remarkable improvement in work.

[EXAMPLE 7]

An example 7 is a modification of the above-described example 6, and in this example 7, a film or layer of $SiO_2$ or $Si_3N_4$ formed by chemical vapor deposition method (CVD) are used in place of the alumina film 667 of FIG. 7B. The film formed on the surface of the substrate 17 is given a desired pattern in the same manner as in the example 6, and the amount of polycrystalline grown on the film pattern is slightly greater than that grown on the alumina film pattern in the example 6, while a uniform single crystal is grown on the remaining regions. The effects of the example 7 substantially equal those of the example 6.

[EXAMPLE 8]

Figure 9:
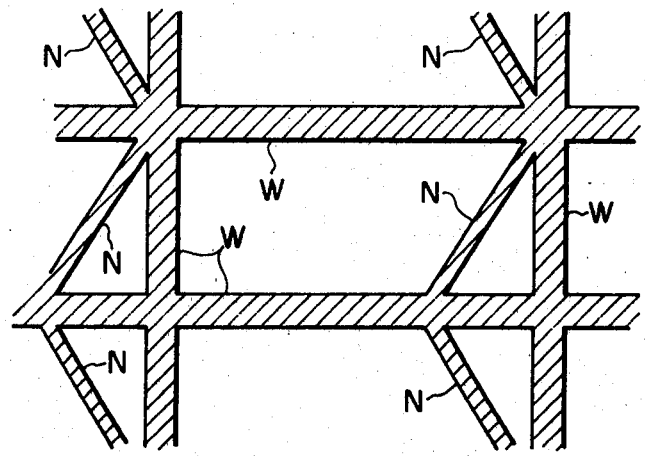
FIG. 9 shows a modified alumina film pattern used for an EXAMPLE 8.

An example 8 is also a modification of the example 6, and in this example 8, the narrow band N in the film pattern made on the substrate is arranged oblique with respect to the wide bands W which intersect at substantially right angles as shown in FIG. 9. Accordingly, the n-type high conductivity region formed on the oblique narrow band N is more readily distinguished from remaining portions. Furthermore, two oblique narrow bands (not shown) may be provided to be arranged in X-fashion for providing the same effect.

[EXAMPLE 9]

Figure 10:
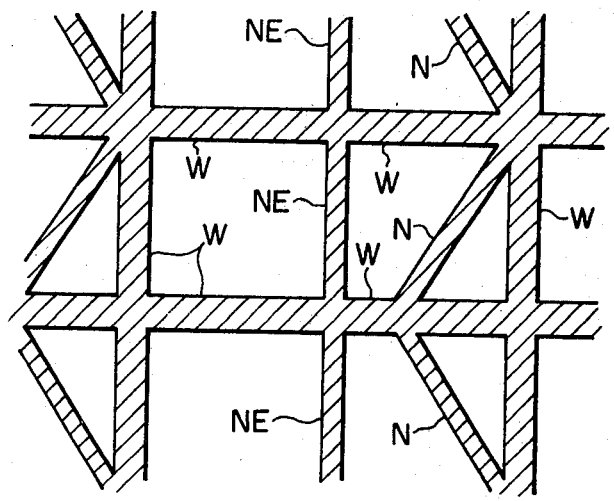
FIG. 10 shows another modified alumina film pattern used for an EXAMPLE 9.

An example 9 is a modification of the above-described example 8. Namely, as shown in FIG. 10 another narrow band NE is additionally provided between i-side electrode portion and the n-side electrode portion in such a manner that the additionally provided narrow band NE bisects the chip. As a result, an extra polycrystalline region is provided to bisect the chip. Because the single crystal region is divided into two small portions, the stress is readily dispersed to further reduce the number of cracks in the crystal.

[EXAMPLE 10]

Figure 11A:
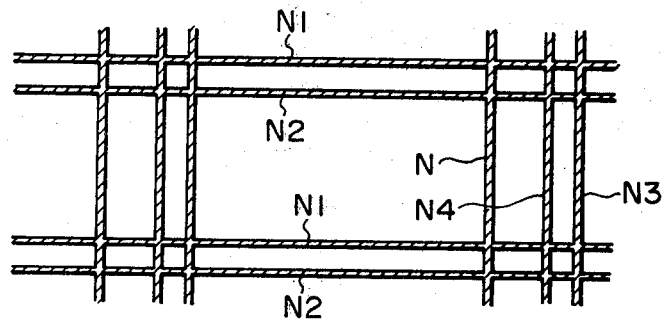
FIGS. 11A and 11B respectively show further modified alumina film patterns used for EXAMPLE 10.

Although in the above described examples, the width of the band corresponding to the kerf portions is wider than the band corresponding to the n-type high conductivity region for the n-side electrode, two narrow bands may be employed in place of such a wider band. FIG. 11A shows a first pattern of the example 10 in which two horizontal narrow bands are arranged parallel having a given distance therebetween. Although the distance between these two narrow bands N1 and N2 is equal to or greater than the kerf width, in this example 10, the width can be reduced for removing undesirable influence caused by a leakage current.

Figure 11B:
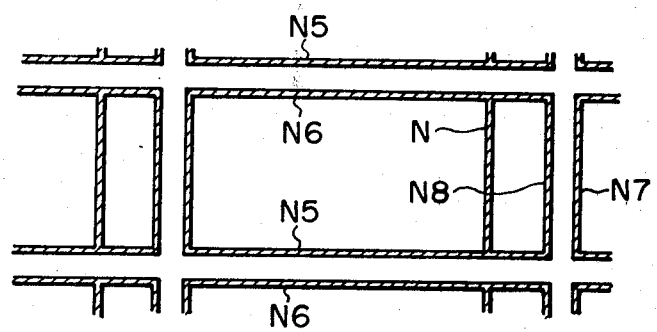

In the same manner two vertical narrow bands N3 and N4 are arranged parallel. The set of the parallel narrow bands N1 and N2 and the other set of parallel narrow bands N3 and N4 may be arranged in a modified second pattern as shown in FIG. 11B, where each of the narrow bands N5 to N8 terminates at each corner of each chip. The example 10 also provides the same effects as those of the example 6.

From the foregoing, it will be understood that two electrodes for performing positive and negative connections can be respectively formed on the upper surface of a light-emitting diode chip owing to the high conductivity region which penetrates the semi-insulating layer. Furthermore, since similar high conductivity regions are made at kerf positions, at which each chip is separated from another, in a light-emitting diode wafer, occurrence of undesirable cracks is remarkably reduced. The former high conductivity region for performing n-side electrode connection may be formed independently of the latter high conductivity region formed at kerf positions. However, if desired, the latter high conductivity region may serve as an electrical conductor as described with reference to the above-mentioned example 4 of FIGS. 4A and 4B.

The above-described embodiments and examples are taken for the description of the instant invention, and therefore, it will be apparent for those skilled in the art that many modifications and variations may be made without departing from the spirit of the invention.

What is claimed is:

1. A light-emitting diode chip comprising:
   (a) a single crystal substrate having a rough area at a given position in one surface thereof;
   (b) a conductive gallium nitride layer formed on said surface of said substrate;
   (c) a semi-insulating galluim nitride layer formed on said conductive gallium nitride layer, said semi-insulating gallium nitride layer including an impurity;
   (d) a high conductivity gallium nitride region formed on said conductive gallium nitride layer, said high conductivity region being formed at a position corresponding to said rough area, and extending to the level of the upper surface of said semi-insulating gallium nitride layer, said high conductivity region being simultaneously formed when said semi-insulating gallium nitride layer is formed to include said impurity, and having a conductance greater than that of the conductive gallium nitride layer, both said conductive gallium nitride layer and said semi-insulating gallium nitride layer being formed by a single epitaxial growth; and
   (e) first and second electrodes respectively formed on said high conductivity region and said semi-insulating gallium nitride layer.

2. A light-emitting diode chip as claimed in claim 1, wherein said rough area is an undulatory portion.

3. A light-emitting diode chip as claimed in claim 1, wherein said rough area comprises one groove or more made on the surface of said substrate.

4. A light-emitting diode chip as claimed in claim 1, wherein said rough area has a strip-like shape.

5. A light-emitting diode chip comprising:
   (a) a single crystal substrate having an insulating film at a given position in one surface thereof;
   (b) a conductive gallium nitride layer formed on said surface of said substrate;
   (c) a semi-insulating gallium nitride layer formed on said conductive gallium nitride layer, said semi-insulating gallium nitride layer including an impurity;
   (d) a high conductivity region formed on said conductive gallium nitride layer, said high conductivity region being formed at a position corresponding to said insulating film, and extending to the level of the upper surface of said semi-insulating gallium nitride layer, said high conductivity region being simultaneously formed when said semi-insulating gallium nitride layer is formed to include said impurity, and having a conductance greater than that of the conductive gallium nitride layer, both said conconductive gallium nitride layer and said semi-insulating gallium nitride layer being formed by a single epitaxial growth; and
   (e) first and second electrodes respectively formed on said high conductivity region and said semi-insulating gallium nitride layer.

6. A light-emitting diode chip as claimed in claim 1 or 5, wherein said high conductivity region is formed along the peripheral portion of said light-emitting diode chip.

7. A light-emitting diode chip as claimed in claim 1 or 5, wherein said high conductivity region is formed at a position surrounding by said semi-insulating layer.

8. A light-emitting diode chip as claimed in claim 1 or 5, wherein said high conductivity region is formed between portions of said semi-insulating layer.

9. A light-emitting diode chip as claimed in claim 1 or 5, further comprising another high conductivity region formed integrally with said conductive gallium nitride layer, said another conductivity region being formed along the peripheral portion of said light-emitting diode chip.

10. A light-emitting diode chip as claimed in claim 1 or 5, wherein said high conductivity region comprises an irregularly grown layer.

11. A light-emitting diode chip as claimed in claim 1 or 5, wherein said high conductivity region comprises a polycrystalline.

12. A light-emitting diode chip as claimed in claim 1 or 5, wherein said substrate is made of a semiconductor.

13. A light-emitting diode chip as claimed in claim 1 or 5, wherein said substrate is made of an insulating material.

14. A light-emitting diode chip as claimed in claim 1 or 5, wherein said substrate is transparent.

15. A light-emitting diode chip as claimed in claim 1 or 5, wherein said substrate is made of sapphire.

16. A light-emitting diode chip comprising:
   (a) a single crystal substrate having a rough area at a given position in one surface thereof;
   (b) a conductive gallium nitride layer formed on said surface of said substrate;
   (c) a semi-insulating gallium nitride layer formed on said conductive gallium nitride layer, said semi-insulating gallium nitride layer including an impurity;
   (d) a high conductivity gallium nitride region formed on said conductive gallium nitride layer, said high conductivity region being formed at a position corresponding to said rough area, and extending to the level of the upper surface of said semi-insulating gallium nitride layer, said high conductivity region being simultaneously formed when said semi-insulating gallium nitride layer is formed to include said impurity, and having a conductance greater than that of the conductive gallium nitride layer, both said conductive gallium nitride layer and said semi-insulating gallium nitride layer being formed by a single epitaxial growth;
(e) first and second electrodes respectively formed on said high conductivity region and said semi-insulating gallium nitride layer; and
(f) a stem assembly having first and second stem electrodes and an insulator for insulating said first and second stem electrodes from each other, said first and second electrodes being respectively mounted on said first and second stem electrode.

17. A light-emittng diode chip comprising:
(a) a single crystal substrate having an insulating film at a given position in one surface thereof;
(b) a conductive gallium nitride layer formed on said surface of said substrate;
(c) a semi-insulating gallium nitride layer formed on said conductive gallium nitride layer, said semi-insulating gallium nitride layer including an impurity;
(d) a high conductivity region formed on said conductive gallium nitride layer, said high conductivity region being formed at a position corresponding to said insulating film, and extending to the level of the upper surface of said semi-insulating gallium nitride layer, said high conductivity region being simultaneously formed when said semi-insulating gallium nitride layer is formed to include said impurity, and having a conductance greater than that of the conductive gallium nitride layer, both said conductive gallium nitride layer and said semi-insulating gallium layer being formed by a single epitaxial growth;
(e) first and second electrodes respectively formed on said high conductivity region and said semi-insulating gallium nitride layer; and
(f) a stem assembly having first and second stem electrodes and an insulator for insulating said first and second stem electrodes from each other, said first and second electrodes being respectively mounted on said first and second stem electrodes.

18. A light-emitting diode as claimed in claim 16 or 17, further comprising a packaging having a lens.

* * * * *